(12) United States Patent
Quevy

(10) Patent No.: US 8,456,252 B2
(45) Date of Patent: *Jun. 4, 2013

(54) DUAL IN-SITU MIXING FOR EXTENDED TUNING RANGE OF RESONATORS

(75) Inventor: Emmanuel P. Quevy, El Cerrito, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/242,602

(22) Filed: Sep. 23, 2011

(65) Prior Publication Data

US 2012/0007693 A1    Jan. 12, 2012

Related U.S. Application Data

(63) Continuation of application No. 12/603,355, filed on Oct. 21, 2009, now Pat. No. 8,058,940.

(60) Provisional application No. 61/108,022, filed on Oct. 24, 2008.

(51) Int. Cl.
*H03B 5/30* (2006.01)
*H03H 9/46* (2006.01)
*H04B 1/26* (2006.01)

(52) U.S. Cl.
USPC ........... 331/154; 310/321; 310/368; 333/186; 333/197; 455/293; 455/323; 455/330

(58) Field of Classification Search
USPC .................. 257/414–416; 310/311, 314, 321, 310/322, 365, 368; 331/116 M, 116 R, 154, 331/155; 333/186, 197, 199; 361/277, 278, 361/280, 281, 287; 455/179.1, 196.1, 255, 455/264, 293, 319, 323, 330, 331

See application file for complete search history.

(56) References Cited

U.S. PATENT DOCUMENTS

| | | | |
|---|---|---|---|
| 3,965,417 A | | 6/1976 | Tompkins |
| 4,344,036 A | | 8/1982 | Dakroub et al. |
| 5,412,359 A | * | 5/1995 | Kazama et al. ............... 333/206 |
| 5,559,358 A | | 9/1996 | Burns et al. |
| 5,581,268 A | * | 12/1996 | Hirshfield ..................... 343/853 |
| 5,839,062 A | | 11/1998 | Nguyen et al. |
| 5,987,304 A | * | 11/1999 | Latt ................................ 455/17 |
| 5,995,815 A | * | 11/1999 | Blom ......................... 455/189.1 |

(Continued)

OTHER PUBLICATIONS

Quevy, "Dual In-Situ Mixing for Extended Tuning Range of Resonators", U.S. Appl. No. 12/603,355, filed Oct. 21, 2009, 30 pgs.

(Continued)

*Primary Examiner* — Levi Gannon
(74) *Attorney, Agent, or Firm* — O'Keefe, Egan, Peterman & Enders LLP

(57) ABSTRACT

A dual in-situ mixing approach for extended tuning range of resonators. In one embodiment, a dual in-situ mixing device tunes an input radio-frequency (RF) signal using a first mixer, a resonator body, and a second mixer. In one embodiment, the first mixer is coupled to receive the input RF signal and a local oscillator signal. The resonator body receives the output of the first mixer, and the second mixer is coupled to receive the output of the resonator body and the local oscillator signal to provide a tuned output RF signal as a function of the frequency of local oscillator signal.

21 Claims, 9 Drawing Sheets

U.S. PATENT DOCUMENTS

| | | | |
|---|---|---|---|
| 6,160,458 | A | 12/2000 | Cole et al. |
| 6,167,097 | A | 12/2000 | Marston et al. |
| 6,262,464 | B1 | 7/2001 | Chan et al. |
| 6,566,786 | B2 | 5/2003 | Nguyen |
| 6,583,739 | B1 * | 6/2003 | Kenington .................... 341/118 |
| 7,211,926 | B2 | 5/2007 | Quevy et al. |
| 7,256,107 | B2 | 8/2007 | Takeuchi et al. |
| 7,514,760 | B1 | 4/2009 | Quevy |
| 7,579,926 | B2 * | 8/2009 | Jhung ........................... 333/133 |
| 7,639,104 | B1 | 12/2009 | Quevy et al. |
| 7,764,131 | B1 | 7/2010 | Seth et al. |
| 7,830,216 | B1 | 11/2010 | Seth et al. |
| 7,982,550 | B1 | 7/2011 | Quevy et al. |
| 8,058,940 | B1 | 11/2011 | Quevy |
| 2007/0207761 | A1 | 9/2007 | LaBerge et al. |

OTHER PUBLICATIONS

Quevy, "Dual In-Situ Mixing for Extended Tuning Range of Resonators", Office Action, U.S. Appl. No. 12/603,355, filed Mar. 3, 2011, 18 pgs.

Quevy, "Dual In-Situ Mixing for Extended Tuning Range of Resonators", Amendment and Response to Office Action, U.S. Appl. No. 12/603,355, filed Jun. 22, 2011, 17 pgs.

Quevy, "Dual In-Situ Mixing for Extended Tuning Range of Resonators", Notice of Allowance and Fees Due, U.S. Appl. No. 12/603,355, filed Jul. 26, 2011, 9 pgs.

Gan et al., "Encapsulated MEMS Device and Method to Form the Same", U.S. Appl. No. 12/124,043, filed May 20, 2008, 48 pgs.

Quevy, "Dual In-Situ Mixing for Extended Tuning Range of Resonators", U.S. Appl. No. 61/108,022, filed Oct. 24, 2008 26 pgs.

* cited by examiner

DUAL IN-SITU MIXING FOR EXTENDED TUNING RANGE OF RESONATORS

RELATED APPLICATIONS

This application is a continuation application of U.S. patent application Ser. No. 12/603,355 filed Oct. 21, 2009, now U.S. Pat. No. 8,058,940, which claims the benefit of U.S. Provisional Patent Application No. 61/108,022, filed on Oct. 24, 2008, each of which is incorporated herein by reference in its entirety.

TECHNICAL FIELD

Embodiments of the invention relate to the field of radio frequency (RF) resonators; and more specifically, to RF resonators having non-linear transducers.

BACKGROUND

A resonator is a device or system that exhibits resonance or resonant behavior, that is, it naturally oscillates at some frequencies, called its resonance frequencies, with greater amplitude than at others. Resonators can be used in, for example, crystal oscillators (also known as quartz oscillators), inductance-capacitive (LC) oscillators, resistance-capacitive (RC) oscillators, and Microelectromechanical systems (MEMS) oscillators, also referred to as micromechanical MEMS oscillators. A crystal oscillator is an electronic circuit that uses the mechanical resonance of a vibrating crystal of piezoelectric material to create an electrical signal with a very precise frequency. Crystal oscillators, such as quartz oscillators, are commonly used to generate frequencies to keep track of time (as in quartz clocks) or to generate a clock signal for digital integrated circuits. Usually, a different crystal is required for each desired frequency. Also, the crystal and the oscillator circuit compliments are typically distinct from one another, i.e., they are not integrated.

Resonators can also be used to select specific frequencies from a signal. Resonators can also be used in filters, such as in a quartz filter (also referred to as a crystal filter), or other piezoelectrics. Quartz resonators, for example, can directly convert their own mechanical motion into electrical signals. Quartz crystal filters have much higher quality factors than LCR filters (also referred to as a resonant circuit, tuned circuit, or RLC circuit) that has a resistor (R), an inductor (L), and a capacitor (C). These filters can be used in RF communication devices, for example, the quartz filter can be used in the intermediate frequency (IF) stages of a radio receiver. The quartz filter can be used for a fixed IF stage frequency because it has a very precise fixed frequency.

In general, electronic filters are electronic circuits which perform signal processing functions, specifically intended to remove unwanted signal components and/or enhance wanted ones. Electronic filters can be passive or active, analog or digital, discrete or continuous, linear or non-linear. The most common types of electronic filters are linear filters. One type of filter is a surface acoustic wave (SAW) filter, which is based on the transduction of acoustic waves. The transduction from electric energy to mechanical energy, in the form of SAWs, is accomplished by the use of piezoelectric materials. In particular, electrical signals are converted to a mechanical wave in a piezoelectric crystal. This wave is delayed as it propagates across the crystal, before being converted back to an electrical signal by further electrodes. The delayed outputs are recombined to produce a direct analog implementation of a finite impulse response filter. This hybrid filtering technique is also found in an analog sampled filter. Electronic devices, employing the SAW, typically utilize one or more inter-digital transducers (IDTs) to convert acoustic wave to electrical signal and vice versa utilizing the piezoelectric effect of certain materials, such as quartz. SAW filters are commonly used in radio-frequency (RF) applications, such as mobile telephones. These SAW filters may provide significant advantages in performance, cost, and size over other filter technologies such as quartz crystals (bulk wave), LC filters, and waveguide filters.

Tuning the center frequency of resonators and filters over a wide range can be difficult. For example, the MEMS resonator frequency is generally sensitive to electrostatic bias voltage, stress and any type of external force applied as control input. The higher the frequency the less sensitive the structure is to external forces, and the more difficult it is to pull its frequency.

Frequency pulling mechanisms are used to trim the frequency accuracy of oscillator and filters, to compensate for any type of drift including temperature, and to serve as a control mechanism for voltage controlled oscillators. These frequency pulling mechanisms may be, for example physical trimming, capacitive pulling, electrostatic pulling, stress or temperature control, or complex closed loop systems with multiple oscillators. For example, in oscillator applications, one can rely on the pulling effect of load capacitor. In such cases, the resonator mechanical frequency remains the same but the oscillator frequency is tuning over a very small range. For example, for quartz based oscillators, this capacitive load is used for temperature compensation and accurate trimming of the center frequency. In the case of MEMS oscillators, additional control can be exercised through the resonator DC Bias voltage ($V_P$) which creates an electrostatic pulling force. The pulling is directly proportional to the mechanical stiffness of the resonator. So, for a given control voltage range, the frequency pulling range will be reduced as the resonator increases in frequency. This control voltage can be used for trimming and temperature compensation.

Designs can be implemented to rely on stress dependence or temperature dependence of mechanical resonators to exercise a control over their center frequency. Physical trimming (etch, deposition) is used to bring the accuracy of resonator inside the specification range, especially for filters (quartz, thin Film Bulk Acoustic Resonator (FBAR), Bulk Acoustic Wave (BAW), MEMS, or the like.). More complex techniques for trimming and compensation of output oscillator at higher frequency have been introduced more recently. They rely on closed loop systems, like Fractional-N PLL or digital frequency discriminator where the main oscillator is locked to a reference oscillator, and their frequency ratio is control digitally. Other approaches may include electrostatic pulling in open-loop configuration, encapsulation of the device into micro-oven to keep temperature constant during fabrication, mechanical compensation of temperature drift, and Fractional-N PLL with reference drifting.

It should be noted that traditional electrostatic pulling is not effective in high-frequency MEMS oscillators. High-frequency MEMS resonators, such as MEMS resonators having approximately 1 MHz frequency or greater, for example, have a very high equivalent stiffness that causes them to have a very small electrostatic frequency pulling range. In MEMS oscillators, capacitive pulling, like used in quartz-based oscillators, may also not be effective to adjust the output frequency for both initial accuracy and temperature stability due to extremely small effective capacitance of the MEMS resonators.

BRIEF DESCRIPTION OF THE DRAWINGS

The invention may best be understood by referring to the following description and accompanying drawings that are used to illustrate embodiments of the invention. In the drawings.

DETAILED DESCRIPTION

Figure 1A:
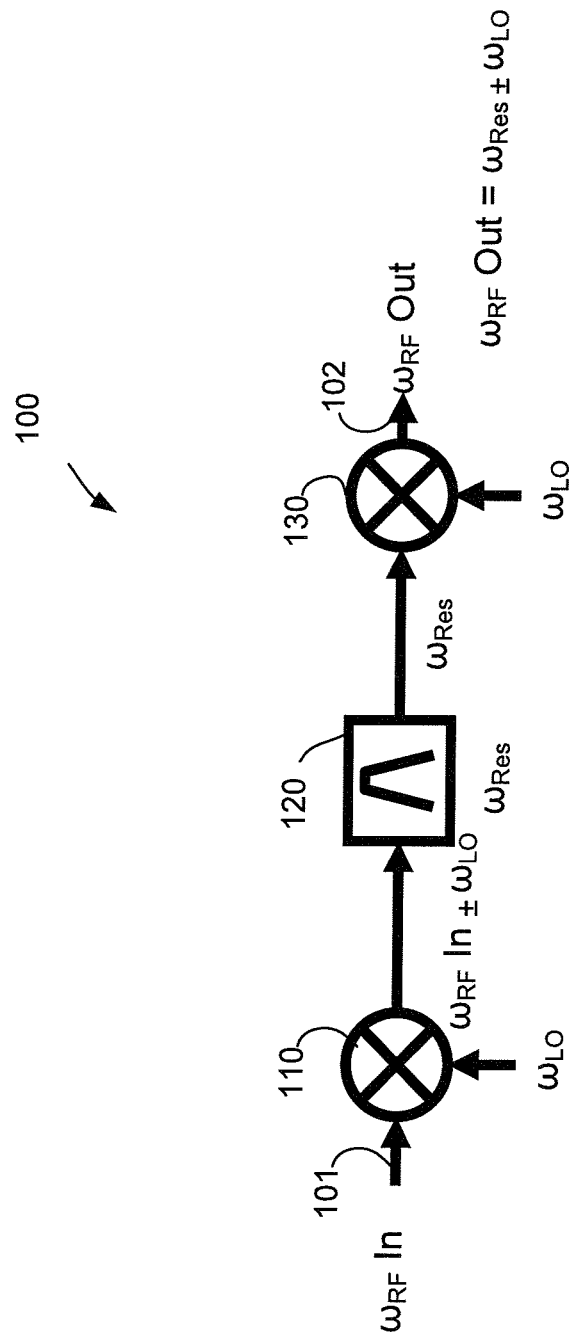
FIG. 1A is a schematic of a dual in-situ mixing device, according to one embodiment.

Disclosed herein is a dual in-situ mixing approach for extended tuning range of resonators. In particular, the embodiments described herein are directed to apparatuses and methods for up- and down-converting a local oscillator signal while an input RF signal serves as the carrier. Two resonance functions result from this operation, allowing for the tuning of their respective frequency as a function of the frequency of the local oscillator signal. In one embodiment, the resonant device includes a resonant body, input and output non-linear transducers, and an external frequency source (e.g., the output of the local oscillator (LO)) is used as a control signal for tuning of the main device. In one embodiment, a resonator is driven by an RF signal and biased by an alternating current (AC) signal. The external frequency source may be made of a low frequency MEMS oscillator controlling a switch to a bias source. Alternatively, the external frequency source may be other types of frequency sources. It should be noted that the nonlinearity of the input and output non-linear transducers is dependent on the driving force applied to the transducer.

As described above, tuning the center frequency of resonators and filters over a wide range can be difficult. For example, the MEMS resonator frequency is generally sensitive to electrostatic bias voltage, stress, and any type of external force applied as control input. The higher the frequency, the less sensitive the structure is to external forces and the more difficult it is to pull its frequency. The embodiments described herein present a mechanism to tune a resonator frequency over a much wider range for an equivalent frequency range, regardless of the center frequency.

The embodiments described herein may provide one or more advantages over the conventional approaches. In particular, the embodiments described herein may provide a wider tuning range for an equivalent frequency range than the conventional designs described above. The embodiments described herein provide a mechanism that is applicable to both oscillators and filters. The embodiments also provide a mechanism that is applicable to absolute accuracy trimming, frequency compensation, and voltage control of oscillators and filters. The embodiments described herein may be used in a single resonator approach for a bank of filters. The embodiments described herein may be used in a simple open-loop system for tuning and trimming.

The embodiments described herein are useful for various types of resonators, such as MEMS, LC, and RC resonators. In some embodiments, the local oscillator is a MEMS oscillator and the resonator is a MEMS resonator. The local oscillator and the resonator may be integrated on an integrated circuit. For example, using the ability to stack oscillators (Silicon Germanium for example) directly on top of CMOS chips, it is possible to dispose the local oscillator and resonator on the integrated circuit which includes the other circuitry. Although various embodiments described herein are described with respect to MEMS resonators, these embodiments may use other types of resonators (e.g., quartz, piezoelectric resonators, optical resonators, dielectric cavity resonators, or the like). It should be noted that the embodiments described herein may be used with linear resonators, because the linear resonator, like a quartz, can be turned into a non-linear device by adding non-linear elements (e.g., diodes) at the input and output stages.

In the following description, for purposes of explanation, numerous specific details are set forth, such as material compositions and chemical regimes, in order to provide a thorough understanding of the invention. It should be apparent to one skilled in the art that the present invention may be practiced without these specific instances. In other instances, well-known features, such as circuits, structures, and techniques, are not described in detail in order to no unnecessarily obscure the present invention. Furthermore, it should be understood that various embodiments shown in the Figures are illustrative representations and are not necessarily drawn to scale.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

FIG. 1A is a schematic of a dual in-situ mixing device, according to one embodiment. The dual in-situ mixing device 100 includes a first non-linear mixer 110, a resonator 120, and a second non-linear mixer 130. The first non-linear mixer 110 receives the input frequency 101 ($\omega_{RF}$ In) and the frequency of the local oscillator ($\omega_{LO}$), and mixes the two frequencies to be provided on the output of the mixer 110. The resonator 120 receives the output of the first mixer 110 (e.g., ($\omega_{RF}$ In±$\omega_{LO}$). The resonant frequency of the resonator 120 is $\omega_{RES}$. The second non-linear mixer 130 receives the output of the resonator filter 120 ($\omega_{WRES}$) and the frequency of the local oscillator ($\omega_{LO}$), and mixes the two frequencies to be provided on the output of the mixer 130. The output of the second non-linear mixer 130 is the RF output frequency 102 ($\omega_{RF}$ Out). The two non-linear elements, mixers 110 and 130, are turned into a dual linear resonating system that can integrated inside a filter or an oscillator to extend the tuning range through the control of an external frequency source.

Figure 1B:
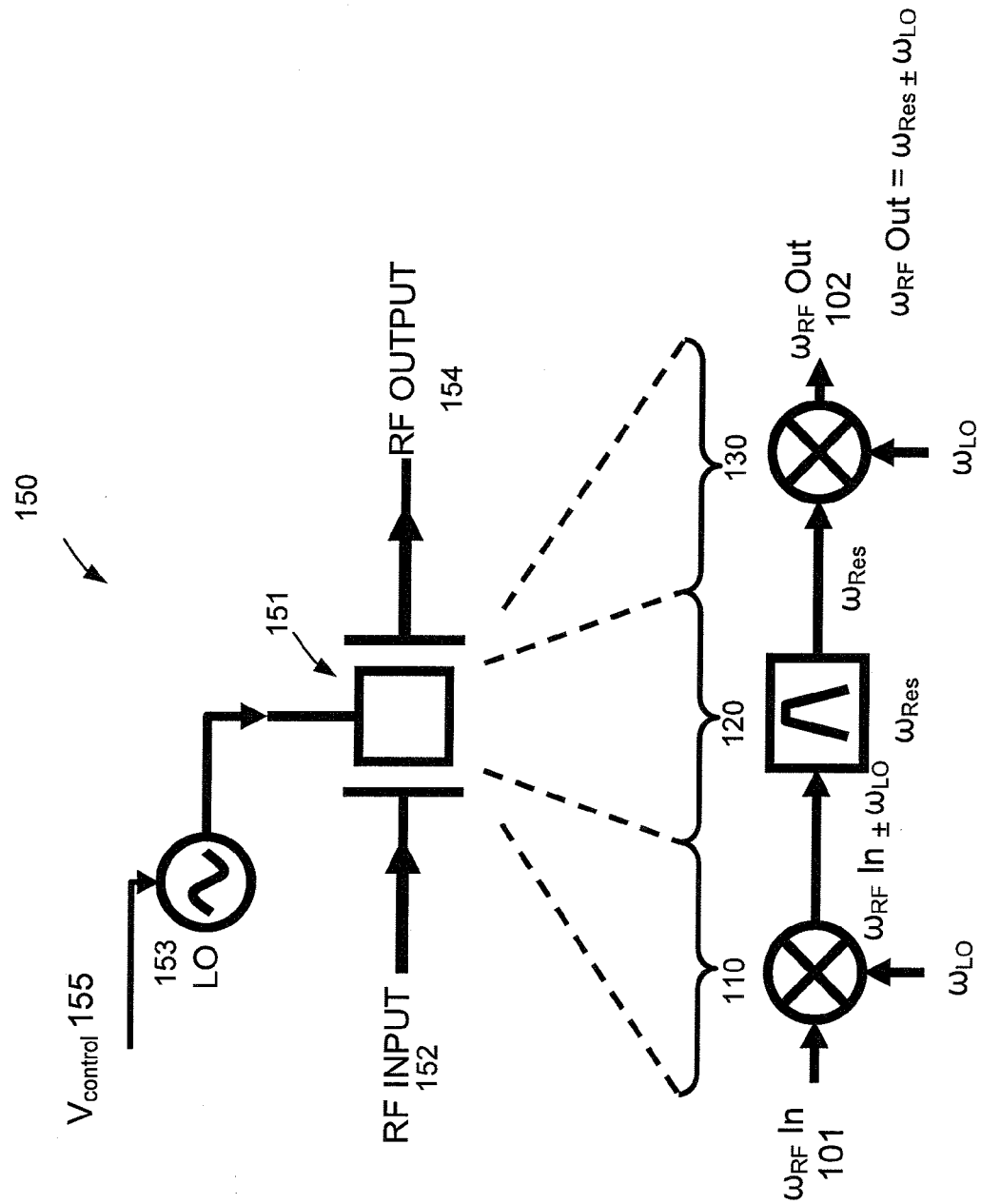
FIG. 1B is a schematic of a mechanical resonating system, having a mechanical resonator and two non-linear transducers, which is driven by a RF signal and biased by an external frequency source, according to one embodiment.

In one embodiment, the first non-linear mixer 110, the resonator 120, and the second non-linear mixer 130 are implemented in a mechanical resonating system having a mechanical resonator and two non-linear transducers. FIG. 1B is a schematic of a mechanical resonating system 150, having a resonator body 151 and two non-linear transducers, which is driven by a RF signal 152 and biased by an external frequency source 153, according to one embodiment. Using the non-linear behavior of the input transducer of the main device as a mixer (e.g., 110), the input RF signal 152 is up-converted to the pass band frequency of the resonator body 151 using the local oscillator 153, and the filtered signal is down converted back to the original RF frequency 102 using the output transducer as a second mixer 130, which outputs the RF output signal 154. Since sidebands are generated both at $(\omega_{RF}-\omega_{LO})$ and $(\omega_{RF}+\omega_{LO})$, two resonance curves consequently appear in the spectrum, separated by $2\times\omega_{LO}$ and centered on $\omega_{Res}$, the resonator frequency. Due to the high-Q filtering properties of the RF resonator, no other frequency component or noise source is transmitted in the RF output 154 other than through direct parasitic coupling between each port of the device. In one embodiment, the resonator body 151 is a MEMS resonator. Alternatively, other mechanical resonators may be used.

These two resonances can be used as individual resonator characteristics for filter or oscillator applications. The two non-linear elements (e.g., mixers 110 and 130) provide the benefit of tunability through the frequency of the external frequency source (LO), which is typically at much lower frequency than the RF resonator $(\omega_{RES})$, thereby providing an extended tuning range as compared to convention approaches.

In the depicted embodiment, the external frequency supply is a local oscillator 153. The local oscillator is controlled by a programmable voltage $(V_{control})$ 155. The programmable voltage 155 controls the output of the local oscillator 153, which is used to bias the resonator body 151. In one embodiment of RF system, the base-band processor, which applies modulation/demodulation techniques (e.g., QPSK, FSK, etc) to code the signal, programs the programmable voltage 155. Alternatively, other processors or controllers can program the programmable voltage 155.

In another embodiment, the first non-linear mixer 110, the resonator 120, and the second non-linear mixer 130 are implemented in an optical resonating system having an optical resonator and two non-linear transducers. In other embodiments, two non-linear elements can be turned into a dual linear resonating system inside filters and oscillators to extend the tuning range through the control of an external frequency source.

In another embodiment, a resonant device includes a main device, having an input non-linear transducer, a resonant body, and an output non-linear transducer. The main device is driven by a RF signal and biased by an external frequency source. In one embodiment, the external frequency source is a local oscillator (LO). The local oscillator may be a MEMS oscillator, or alternatively, other types of oscillators. It should be noted that the nonlinearity of the input and output non-linear transducers is dependent on the driving force applied to the transducer. The output of the external frequency source is used as a control signal to bias the resonator body. The control signal may be an AC signal. Like described above, the input non-linear transducer drives the resonator body according to the RF input signal. The input non-linear transducer operates to up-convert the LO signal, while the RF input signal serves as the carrier. While the input non-linear transducer operates as a driving electrode, the output non-linear transducer operates as a sensing electrode. The output non-linear transducer outputs the RF output signal. The output non-linear transducer operates to down-covert the LO signal 103. In effect, two resonance functions result from this operation, allowing for the tuning of their respective frequencies as a function the LO frequency (e.g., frequency of the control signal).

Figure 2A:
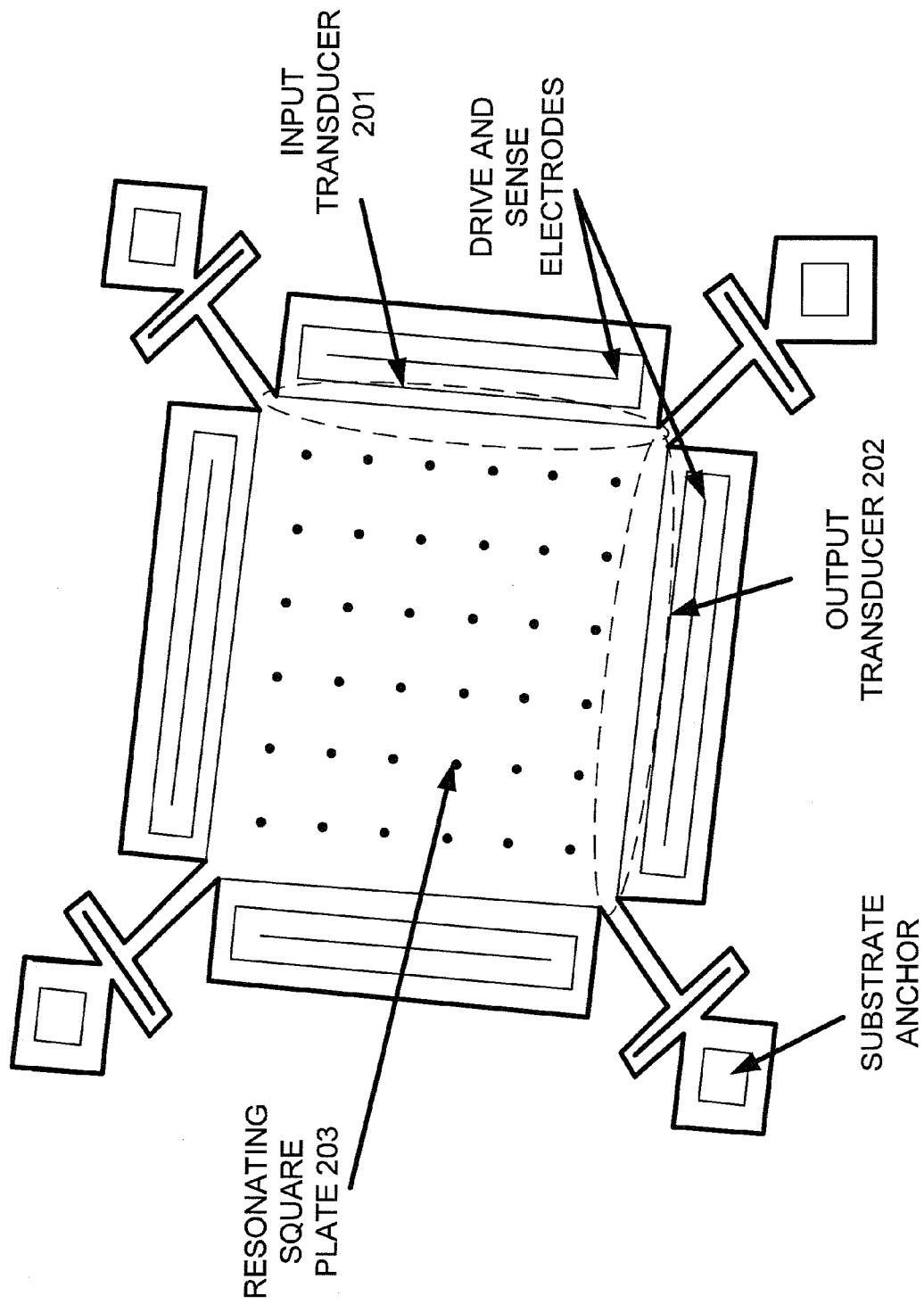
FIG. 2A is a tilted view of a scanning electron microscope image of the device, according to one embodiment.
Figure 2B:
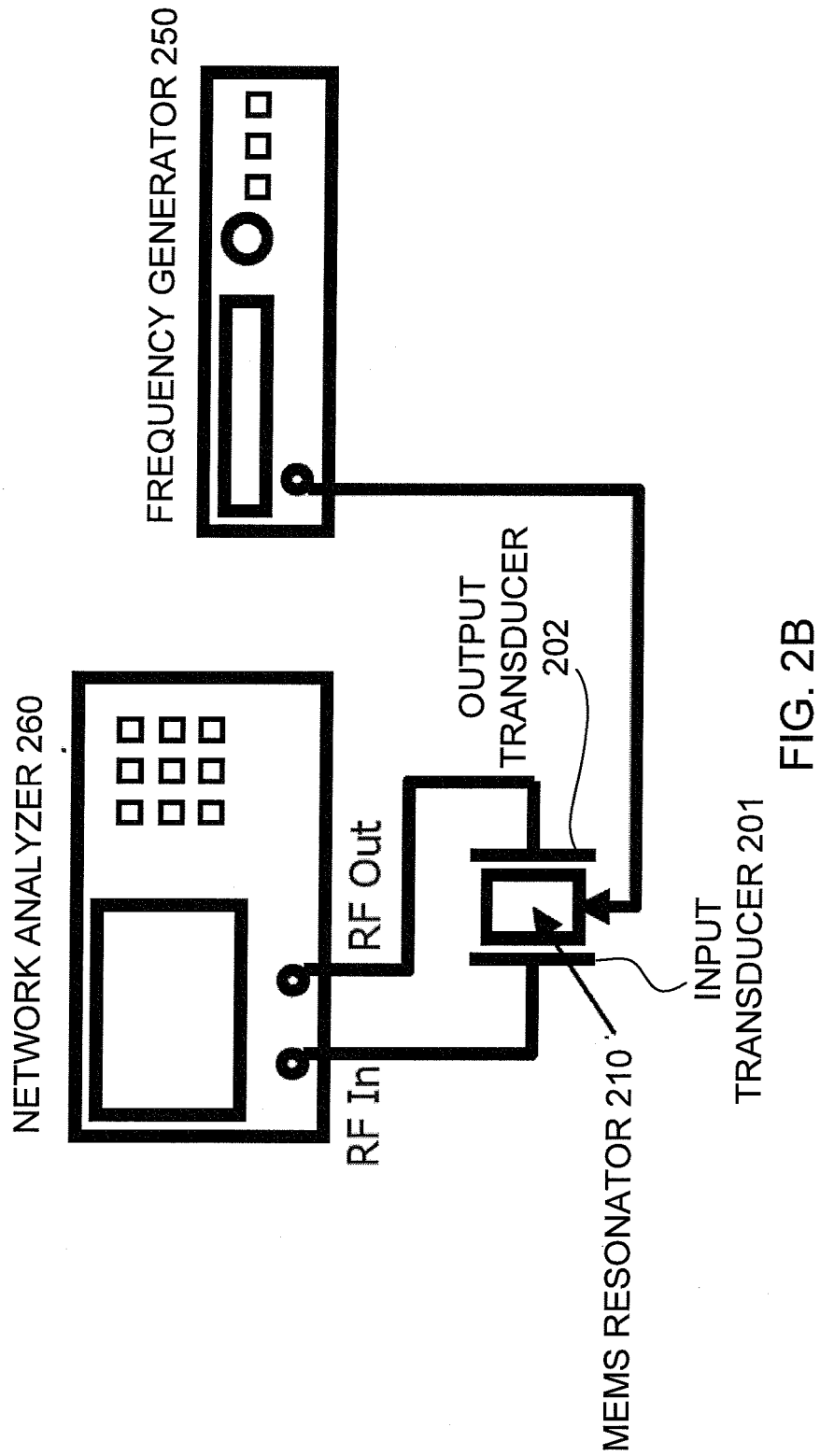
FIG. 2B is the experimental setup for verification of the dual in-situ mixing technique, according to one embodiment.

The dual in-situ mixing technique is verified experimentally using a 21 MHz square mode resonator as shown in FIG. 2A. FIG. 2A is a titled view of a scanning electron microscope image of the device according to one embodiment. The input and output transducers 201 and 202 are non-linear electrostatic transducers, and in this embodiment, are non-linear lateral capacitive gaps. The experimental setup used to test the resonator of FIG. 2A is shown in FIG. 2B. The RF signal is sent to the input electrode 201, and a signal generator 250 delivers the local oscillator signal directly into the body of the MEMS resonator 210 (e.g., resonating square plate 203 of FIG. 2A). The transmission characteristic of the device is recorded through a network analyzer 260. The amplitude and phase response of the dual in-situ mixing device of FIG. 2A is illustrated in FIG. 3.

Figure 3:
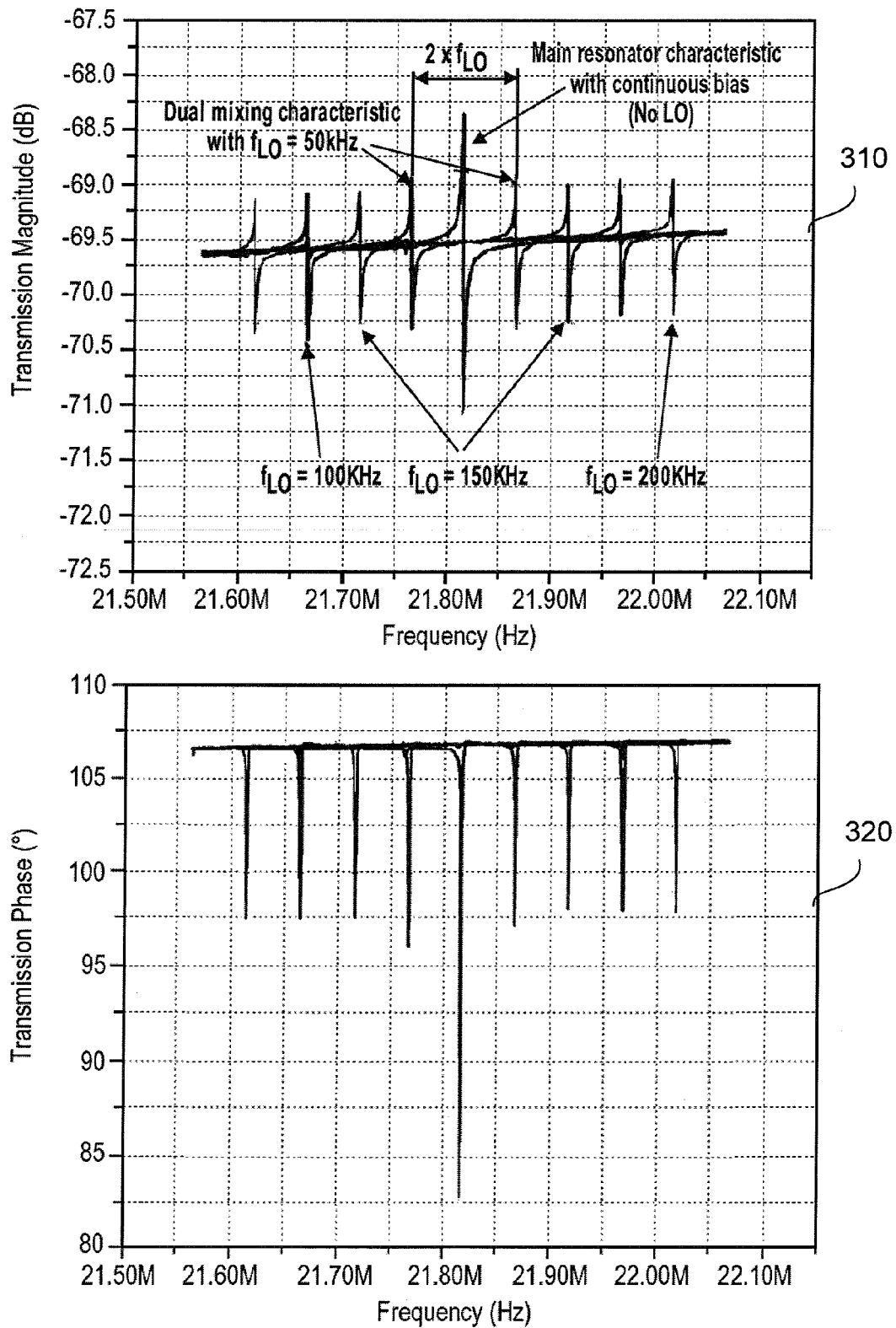
FIG. 3 illustrate the amplitude and phase response of the dual in-situ mixing device of FIG. 2A for various frequencies of the local oscillator signal applied to the resonator body.

FIG. 3 combines the amplitude and phase response of the dual in-situ mixing device of FIG. 2A for various frequencies of the local oscillator (LO) signal applied to the resonator body. The top diagram illustrates the amplitude diagram 310, and the bottom diagram illustrates the corresponding phase diagram 320 of the device transmission characteristics for the various local oscillator frequencies. Two resonance curves are visible with a clear correlation of their center frequency with the LO frequency and the mechanical resonance frequency enabling the wide tuning range (e.g., more the 1%) mechanism proposed in the embodiments described herein. In one embodiment, the theoretical tuning limit is approximately fifty percent of the resonant frequency of the resonator 120 $(\omega_{RES})$; however, practical limits might be different based on the particular device. It should be noted that by adding a direct current (DC) offset to the LO waveform, the RF resonator characteristic appears on the spectrum in addition to the two mixing-generated resonance curves.

Figure 4:
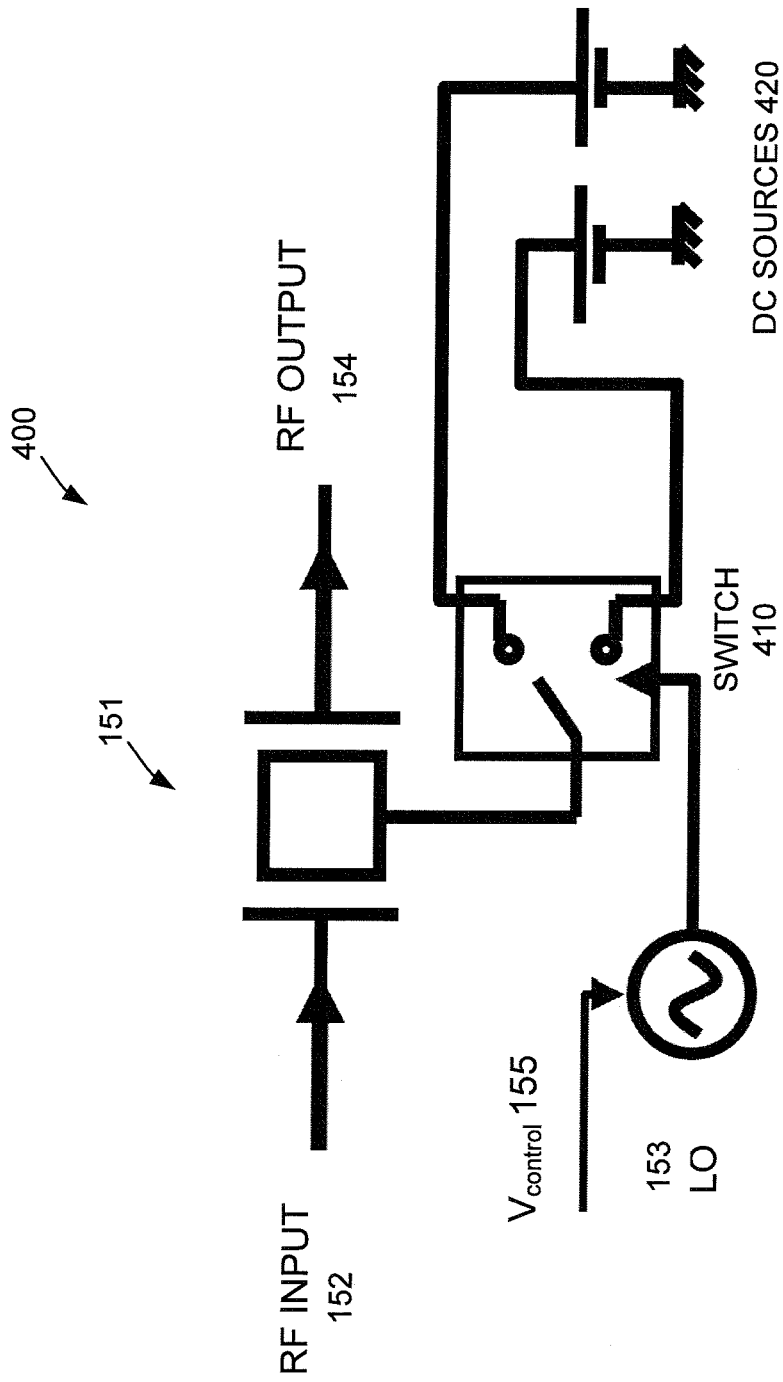
FIG. 4 is a schematic of a mechanical resonating system, which is biased by an external frequency source having a switch to connect a DC bias source on and off to the resonator body, according to one embodiment.

It should also be noted that the local oscillator can only drive the resonator body directly if its output voltage is sufficient to generate enough signal level. In another embodiment, one can use the local oscillator signal to drive a switch connecting a DC bias source on and off to the resonator body as shown in FIG. 4. This scheme allows flexibility in the local oscillator signal driving voltage.

FIG. 4 is a schematic of a mechanical resonating system 400, which is biased by an external frequency source 153 (LO) having a switch 410 to connect a DC bias source 420 on and off to the resonator body 151, according to one embodiment. The mechanical resonating system 400 is similar to the mechanical resonating system 150, as designated by similar reference labels. The mechanical resonating system 400 includes a switch 410, which is controlled by the local oscillator signal (LO) from the external frequency source 153. The external frequency source 153 controls the switch 410 to switch between two DC bias sources 420. In this embodiment, the switch 410 connects one of the two DC bias sources 420 to the resonator body 151. In other embodiments, the switch 410 can connect a DC bias source on or off to the resonator body 151.

Application to Temperature Compensation and On-Chip Trimming of Oscillator and Filters:

Intrinsically, all resonators exhibit dependence in temperature. In MEMS resonators, this is particularly important, on the order of a few tens of parts per million per degree (ppm per °C.). For oscillator and closely spaced channel filters, this needs to be compensated. Using the embodiments described herein, the local oscillator signal (LO) can be designed to have a temperature behavior which compensates for the behavior of the RF resonator such that the two generated resonance functions become stable across temperature. In one embodiment, the LO can be designed to have a temperature behavior which compensates exactly for the behavior of the RF resonator. In one embodiment, the local oscillator signal compensation behavior can be addressed through the intrinsic temperature behavior of the oscillator by designing the intrinsic temperature behavior of the oscillator to be opposite to the RF resonator behavior. In another embodiment, the local oscillator signal compensation behavior can also be addressed by generating a temperature function controlling the frequency of the oscillator through a control voltage like a voltage controlled oscillator (VCO).

The embodiments described herein can be used in conjunction with methods and apparatuses for temperature compensation and control, such as those described in U.S. patent Ser. No. 11/716,115, filed Mar. 9, 2007, U.S. patent Ser. No. 12/236,454, filed Sept. 23, 2008, U.S. patent Ser. No. 12/217,190, filed Jul. 1, 2008, and U.S. patent Ser. No. 12/236,456, filed Sept. 2, 2008, all commonly assigned to the present assignee. The embodiments described herein can also be used in conjunction with other methods and apparatuses for temperature compensation and control, such as described in U.S. Pat. No. 7,211,926, U.S. Pat. No. 6,160,458, U.S. Pat. No. 6,167,097, U.S. Pat. No. 4,344,036, as well as other approaches for temperature compensation and control as would be appreciated by one of ordinary skill in the art having the benefit of this disclosure. Using previously disclosed methods for temperature compensation and control, the embodiments described herein and along with integration of multiple MEMS on CMOS can be leveraged to address the temperature compensation problem for frequencies and topologies that are not practically compensated, like high frequency resonators or coupled-resonator arrays.

The same way the local oscillator signal is used as a control system for the generated resonant frequencies, in one embodiment, the initial accuracy can be set by trimming the frequency of the LO, which can be more practical given its wider tuning range for it being at lower frequency than the RF carrier.

Voltage Control of Oscillators

The embodiments described herein may be used in VCO applications. Assuming the RF carrier is set at high frequency where any pulling mechanism becomes inefficient, the local oscillator signal can be designed as a VCO with high sensitivity to a control voltage ($V_{control}$ in FIG. 1). The RF resonator becomes controlled by the LO control voltage and can be used as the resonant part of an RF oscillator.

Filter Applications for Signal Processing

The embodiments described herein can be used to generate large amount of filtering channels for communication devices or signal processing systems in general.

Figure 5:
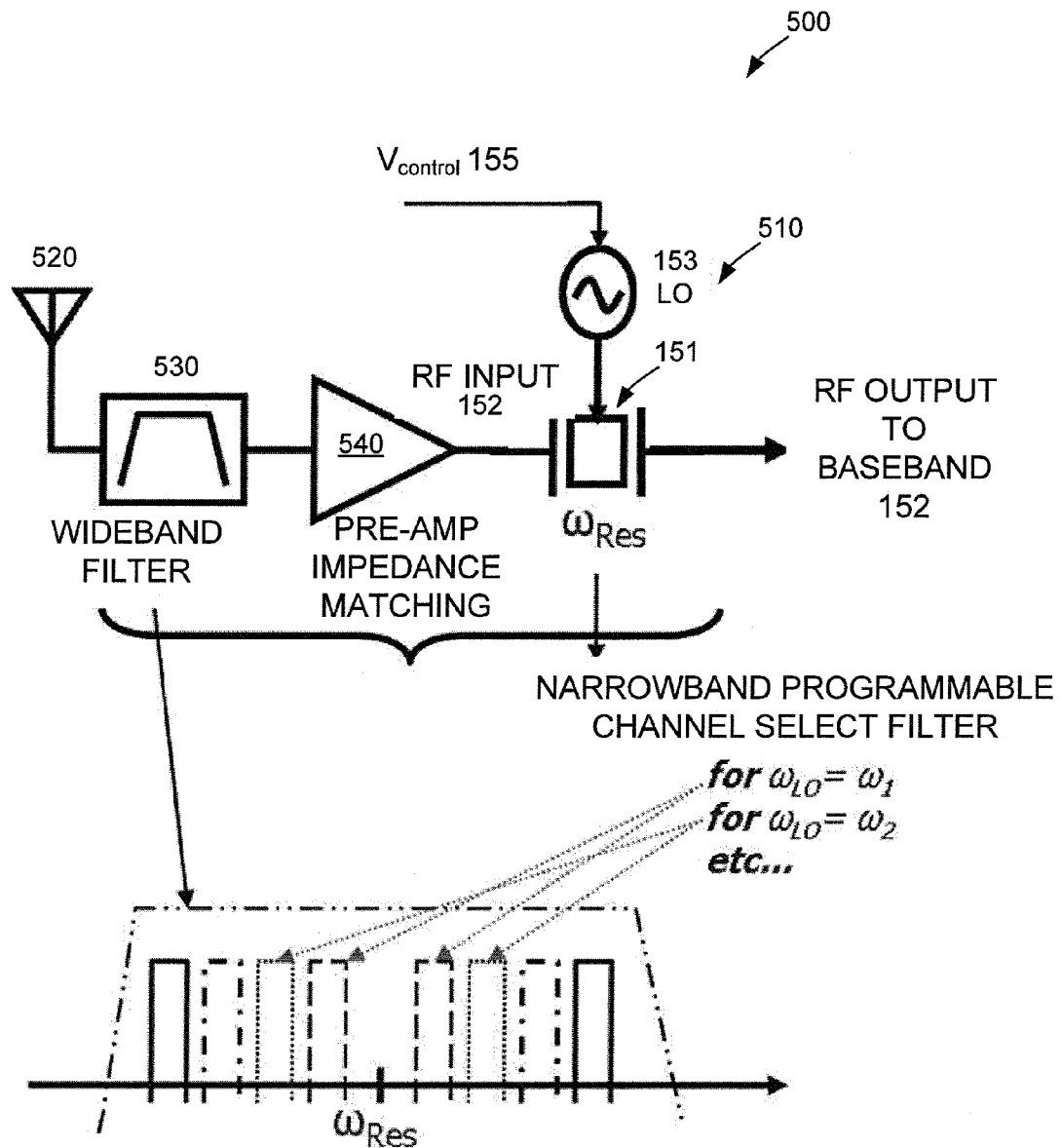
FIG. 5 is a schematic of frontend architecture of a receiver having a single narrowband tunable RF filter, according to one embodiment.

FIG. 5 is a schematic of frontend architecture of a receiver 500 having a single narrowband tunable RF filter, according to one embodiment. The receiver 500 has the RF filter 510, which has the components of the mechanical resonating system 150 of FIG. 1B, as designated by similar reference labels, and antenna 520. In another embodiment, the receiver 500 also includes the wideband filter 530, and the pre-amplifier 540 for impedance matching. The antenna 520 receives an RF signal over the air, and passes the signal through the wideband filter 530, as illustrated in the bottom graph of FIG. 5 as the line having alternating dash and two dots. The signal may also be amplified using the pre-amplifier 540 for impedance matching. In other embodiments, additional or other types of receiver frontend components may be used.

For a given $V_{control}$ signal 155, two channels are generated simultaneously by each RF resonator and local oscillator signal combination. By tuning the $V_{control}$ frequency ($\omega_{LO}$), these channels can be tuned at other frequencies and create closely-spaced channels. This becomes a narrowband programmable channel filter. A narrowband programmable channel select filter is a key building block in secure radios, software defined radios, cognitive radios, or the like.

In other embodiments, the dual in-situ mixing device may be used in other applications, such as compact network and spectrum analyzers, which extensively use tunable filters as part of their architecture. Analog to digital converters (ADC) can benefit from the embodiments described herein to increase their dynamic range over wide band analog signals. In one embodiment, the signal is divided into small frequency channels that are digitized through an array of low dynamic range narrow band ADC, and then recombined digitally into a wideband high dynamic range discrete signal.

Figure 6:
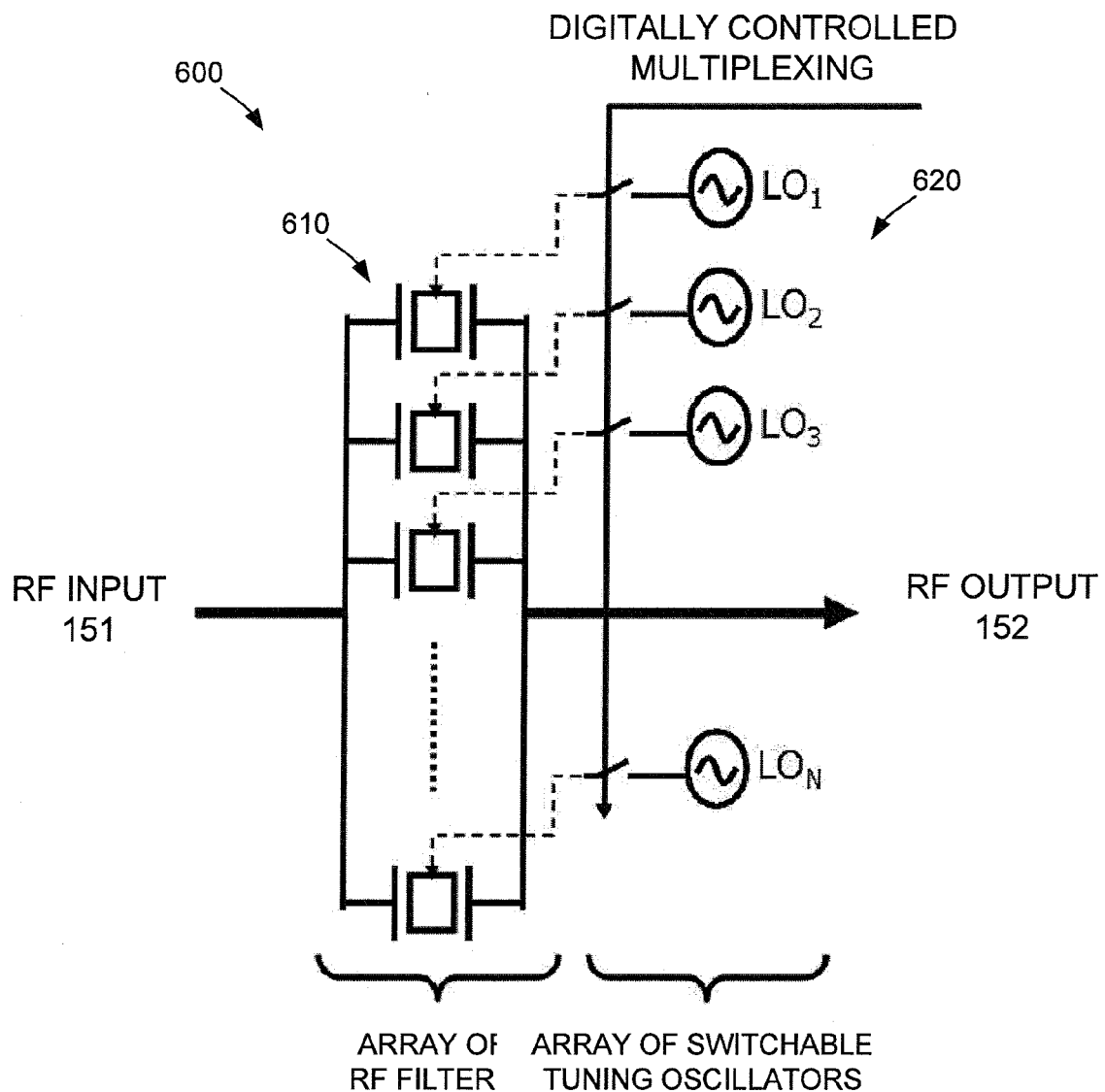
FIG. 6 is a schematic of a receiver path having a bank of filters for signal processing, according to one embodiment.

In other embodiments where multiple channels need to be ON simultaneously, FIG. 6 shows an embodiment of a receiver path subsystem where filters can be switched in and out from the signal path using its corresponding local oscillator signal (LO). The receiver path 600 includes multiple RF filters 610 (e.g., 1 through N, where N is a positive integer), which are each coupled to a corresponding local oscillator 620 (e.g., 1 through N) of an array of local oscillators. In one embodiment, the main RF filters 610 can be identical with loose manufacturing tolerance in term of center frequency ($\omega_{RES}$), and one can rely on the array of local oscillators to set each channel at the right frequency. In one embodiment of receiver frontend architecture, the RF filters 610 can be centered in distinct bands to enable flexible multi-standard communication or optimize spectrum utilization as a function of the network conditions.

This method may be particularly suited for high-channel density where the relative frequency difference between each channel is very small compared to fabrication or tuning tolerances. It should be noted that is easier to overcome such tolerance specification at lower frequencies. For example, if channels have to be spaced by 30 kHz at around 3 GHz, generating a parallel bank of filters would require 10 ppm relative matching accuracy between each channel. For example, in one embodiment, where an array of 3 MHz local oscillators 620 driving 3 GHz filters 610 are used, the relative tolerance between oscillators becomes 1% for a 30 kHz equal spacing, which is much more practical than conventional approaches.

This approach can be particularly useful for secure radio communication systems with anti-jamming capability when the LO frequency is modulated so that the receiving channel is patterned in the spectrum as a function of time. This pattern becomes a key to decode a spread spectrum transmission, for example.

Another extension of the use of the embodiment shown in FIG. 6 is to match all RF filters 610 perfectly by using the local oscillator signals independently to trim center frequencies. The filter array becomes one dual channel device with insertion loss inversely proportional to the number of matched devices in the array. Low insertion loss is critical for RF matching. Alternatively, a larger bandwidth low ripple filter can be created by tuning each filter frequency close to each other.

Applications for Modulation Techniques

The embodiments described herein may also be used in specific applications of modulation/demodulation techniques, such as QPSK, FSK, or the like, in various RF systems.

Figure 7:
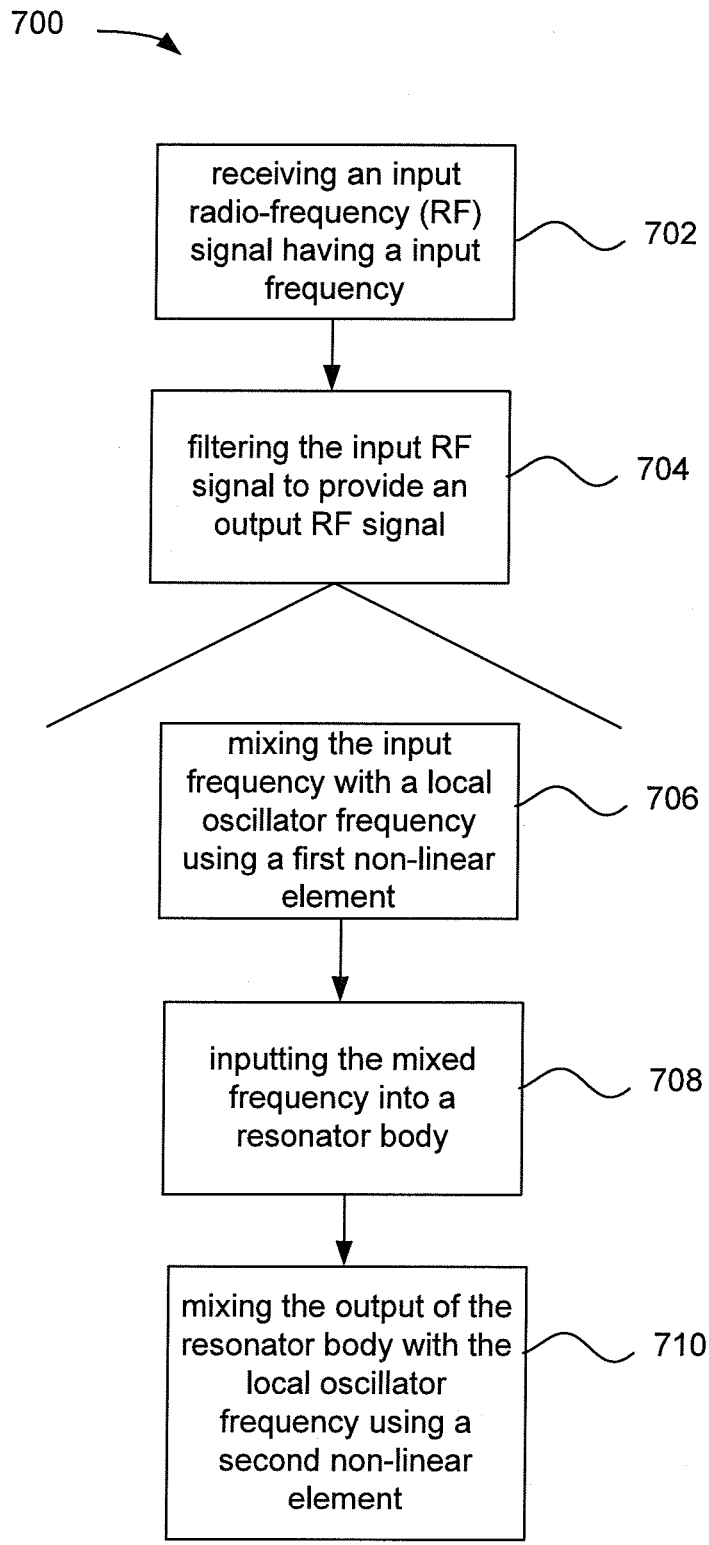
FIG. 7 is a flow diagram of a method for filtering an input RF signal according to one embodiment.

FIG. 7 is a flow diagram of a method for filtering an input RF signal according to one embodiment. The method 700 includes receiving the input RF signal having the input frequency (block 702), and filtering the input RF signal to provide an output RF signal (block 704). In one embodiment, the filtering is performed by mixing the input frequency with a local oscillator frequency using a first non-linear element (block 706); inputting the mixed frequency into a resonator body (block 708); and inputting the mixed frequency into a resonator body (block 710). Alternatively, other operations may be performed, in accordance with the embodiments described herein.

It should be noted that although the MEMS device depicted in FIG. 2A has a resonating square plate, in other embodiments, the MEMS device may be any device that falls within the scope of MEMS technologies. For example, as described in U.S. patent Ser. No. 12/124,043, filed May 20, 2008, the MEMS device may be any mechanical and electronic structure having a critical dimension of less than approximately 250 microns and fabricated above a substrate using lithography, deposition, and etching processes. In accordance with an embodiment of the present invention, the MEMS device is a resonator, and can be used in various applications, such as in oscillators, filters, detectors, or sensors, such as a temperature sensor, a pressure sensor, or an inertial sensor (such as an accelerometer or a gyroscope). The MEMS device may have a suspended portion, such as a suspended feature having a resonant frequency. For example, in an embodiment, the suspended portion is a feature such as, but not limited to, a beam, a plate, a cantilever arm or a tuning fork. In a specific embodiment, the MEMS device includes a resonating feature flanked by a driver electrode and a sensor electrode.

In other embodiments, an integrated circuit having the MEMS device may be formed. In one embodiment, the structure includes multiple semiconductor devices formed on a substrate. Multiple interconnects are formed above and coupled with the semiconductor devices, incorporating the semiconductor devices into the integrated circuit. The MEMS resonator may be formed above and coupled with the multiple interconnects. In a specific embodiment, the MEMS resonator is comprised of a member, a driver electrode and a sensor electrode, i.e. the MEMS resonator has more than one port. The driver electrode and the sensor electrode are electrically coupled with the plurality of interconnects.

A MEMS structure having a resonating member and more than one port, i.e. distinct driver and sensor electrodes, may enhance the performance and reliability of a MEMS device built from the MEMS structure. For example, in accordance with an embodiment of the present invention, a MEMS resonator is comprised of a resonating member and distinct driver and sensor electrodes. The pair of electrodes is electrically coupled with multiple interconnects in order to drive and sense a signal from the resonating member. However, because two ports are provided, parasitics associated with the signal from the resonating member are reduced. By carefully selecting the fabrication conditions of the MEMS resonator, an IC-compatible MEMS structure may be formed. For example, in accordance with an embodiment of the present invention, a MEMS resonator having a resonating member and distinct driver and sensor electrodes is formed in the same plane, e.g. the same functional layer housed in a stack of material layers. In one embodiment, a MEMS structure is fabricated on a CMOS circuit subsequent to formation of the CMOS circuit. In one embodiment, for optimal integration of the MEMS structure with the CMOS circuit, all process steps used to form the MEMS resonator are carried out at a temperature less than approximately 450° C.

A MEMS structure may be fabricated having a resonating member along with distinct driver and sensor electrodes, as illustrated and described with respect to U.S. patent Ser. No. 11/716,284, filed Mar. 9, 2007. Alternatively, the MEMS structure may be fabricated according to other methods as would be appreciated by one of ordinary skill in the art.

The MEMS device may have any dimensions suitable for a desired MEMS function, also as described, for example, in U.S. patent Ser. No. 11/716,284, filed Mar. 9, 2007.

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. A dual in-situ mixing apparatus, comprising:
  a first non-linear mixer configured to receive an input frequency and to mix the input frequency with a frequency of a local oscillator to generate a first mixer output signal;
  a resonator configured to receive the first mixer output signal and to generate a resonance frequency spectrum in response to the first mixer output signal; and
  a second non-linear mixer configured to receive the resonance frequency spectrum and to mix the resonance frequency spectrum with the frequency of the local oscillator to generate a second mixer output signal, the second mixer output signal having a frequency that is equal to the input frequency.

2. The apparatus of claim 1, where the resonance frequency spectrum includes a resonant frequency of the resonator that is centered between two sideband resonance functions; and where the frequency of the local oscillator is a control signal for tuning the frequency of each of the two sideband resonance functions.

3. The apparatus of claim 1, where the resonator comprises at least one of an inductance-capacitive (LC) oscillator, a resistance-capacitive (RC) oscillator, or a microelectromechanical systems (MEMS) oscillator.

4. The apparatus of claim 1, where the first non-linear mixer is configured to generate the first mixer output signal by mixing the input frequency with the frequency of the local oscillator to up-convert the input frequency to a pass-band frequency of the resonator; and where the second non-linear mixer is configured to mix the resonance frequency spectrum with the frequency of the local oscillator to down-convert the resonance frequency spectrum to generate the second mixer output signal with a frequency that is equal to the input frequency.

5. The apparatus of claim 1, where the first non-linear mixer is configured to receive a radio frequency (RF) signal frequency as the input frequency.

6. A dual in-situ mixing apparatus, comprising:
  a first non-linear mixer configured to receive an input frequency and to mix the input frequency with a frequency of a local oscillator to generate a first mixer output signal;
  a resonator configured to receive the first mixer output signal and to generate a resonance frequency spectrum in response to the first mixer output signal; and a second non-linear mixer configured to receive the resonance frequency spectrum and to mix the resonance frequency spectrum with the frequency of the local oscillator to generate a second mixer output signal;

where the first non-linear mixer is configured to generate the first mixer output signal by mixing the input frequency with the frequency of the local oscillator to up-convert the input frequency to a pass-band frequency of the resonator; and where the second non-linear mixer is configured to mix the resonance frequency spectrum with the frequency of the local oscillator to down-convert the resonance frequency spectrum to generate the second mixer output signal.

7. The apparatus of claim 6, where the input frequency comprises a radio frequency (RF) input signal; and where the frequency of the local oscillator comprises a frequency of an alternating current (AC) control signal from an external frequency source.

8. The apparatus of claim 7, where the resonance frequency spectrum includes a resonant frequency of the resonator that is centered between two sideband resonance functions; and where the AC control signal is a control signal for tuning the frequency of each of the two sideband resonance functions.

9. The apparatus of claim 8, where the resonator comprises a microelectromechanical systems (MEMS) oscillator.

10. The apparatus of claim 7, where the first non-linear mixer is configured to generate the first mixer output signal by mixing the RF input signal with the AC control signal to up-convert the RF input signal to a pass-band frequency of the resonator; and where the second non-linear mixer is configured to mix the resonance frequency spectrum with the AC control signal to down-convert the resonance frequency spectrum to generate the second mixer output signal with a frequency that is equal to the frequency of the RF input signal.

11. A method, comprising:
mixing an input frequency with a frequency of a local oscillator using a first non-linear element to generate a first mixed output signal;
inputting the first mixer output signal to a resonator and generating a resonance frequency spectrum using the resonator in response to the first mixed output signal; and
mixing the resonance frequency spectrum with the frequency of the local oscillator using a second non-linear element to generate a second mixed output signal, the second mixed output signal having a frequency that is equal to the input frequency.

12. The method of claim 11, further comprising using the frequency of the local oscillator as a control signal to tune the resonance frequency spectrum by varying the frequency of the local oscillator control signal to tune the resonance frequency spectrum.

13. The method of claim 11, where the resonance frequency spectrum includes a resonant frequency of the resonator that is centered between two sideband resonance functions; and where the method further comprises using the frequency of the local oscillator as a control signal to tune the frequency of each of the two sideband resonance functions.

14. The method of claim 11, where the resonator comprises at least one of an inductance-capacitive (LC) oscillator, a resistance-capacitive (RC) oscillator, or a microelectromechanical systems (MEMS) oscillator.

15. The method of claim 11, further comprising generating the first mixed output signal by mixing the input frequency with the frequency of the local oscillator using the first non-linear element to up-convert the input frequency to a pass-band frequency of the resonator; and mixing the resonance frequency spectrum with the frequency of the local oscillator using the second non-linear element to generate the second mixed output signal with a frequency that is equal to the input frequency.

16. The method of claim 11, where input frequency is a radio frequency (RF) signal frequency.

17. A method, comprising:
mixing an input frequency with a frequency of a local oscillator using a first non-linear element to generate a first mixed output signal;
inputting the first mixer output signal to a resonator and generating a resonance frequency spectrum using the resonator in response to the first mixed output signal;
mixing the resonance frequency spectrum with the frequency of the local oscillator using a second non-linear element to generate a second mixed output signal; and
where the method further comprises:
generating the first mixed output signal by mixing the input frequency with the frequency of the local oscillator using the first non-linear element to up-convert the input frequency to a pass-band frequency of the resonator, and
mixing the resonance frequency spectrum with the frequency of the local oscillator using the second non-linear element to down-convert the resonance frequency spectrum to generate the second mixed output signal with a frequency that is equal to the input frequency.

18. The method of claim 17, where the input frequency comprises a radio frequency (RF) input signal; and where the frequency of the local oscillator comprises a frequency of an alternating current (AC) control signal from an external frequency source.

19. The method of claim 18, where the resonance frequency spectrum includes a resonant frequency of the resonator that is centered between two sideband resonance functions; and where the method further comprises using the frequency of the AC control signal as a control signal to tune the frequency of each of the two sideband resonance functions.

20. The method of claim 18, where the resonator comprises a microelectromechanical systems (MEMS) oscillator.

21. The method of claim 18, further comprising generating the first mixed output signal by mixing the RF input signal with the AC control signal using the first non-linear element to up-convert the RF input signal to a pass-band frequency of the resonator; and mixing the resonance frequency spectrum with the AC control signal using the second non-linear element to down-convert the resonance frequency spectrum to generate the second mixed output signal with a frequency that is equal to the frequency of the RF input signal.

* * * * *